United States Patent
Hao et al.

(10) Patent No.: US 10,008,663 B1
(45) Date of Patent: Jun. 26, 2018

(54) PERPENDICULAR MAGNETIC FIXED LAYER WITH HIGH ANISOTROPY

(71) Applicant: Avalanche Technology, Inc., Fremont, CA (US)

(72) Inventors: Xiaojie Hao, Fremont, CA (US); Zihui Wang, Milpitas, CA (US); Huadong Gan, Fremont, CA (US); Yuchen Zhou, San Jose, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days. days.

(21) Appl. No.: 15/491,220

(22) Filed: Apr. 19, 2017

(51) Int. Cl.
| | |
|---|---|
| *H01L 43/10* | (2006.01) |
| *H01L 43/08* | (2006.01) |
| *H01L 43/02* | (2006.01) |
| *G11C 11/16* | (2006.01) |
| *H01L 27/22* | (2006.01) |

(52) U.S. Cl.
CPC ............ *H01L 43/10* (2013.01); *G11C 11/161* (2013.01); *H01L 27/222* (2013.01); *H01L 43/02* (2013.01); *H01L 43/08* (2013.01)

(58) Field of Classification Search
CPC ....... H01L 43/10; H01L 27/22; H01L 27/226; H01L 43/00; H01L 43/02; H01L 43/08
USPC ....................................................... 257/421
See application file for complete search history.

(56) References Cited

U.S. PATENT DOCUMENTS

| | | | |
|---|---|---|---|
| 8,184,411 B2 | 5/2012 | Zhang et al. | |
| 8,541,855 B2 | 9/2013 | Jan et al. | |
| 2003/0200927 A1 | 10/2003 | Watanabe et al. | |
| 2005/0185455 A1 | 8/2005 | Huai | |
| 2006/0098354 A1 | 5/2006 | Parkin | |
| 2010/0096716 A1 | 4/2010 | Ranjan et al. | |
| 2010/0230770 A1 | 9/2010 | Yoshikawa et al. | |
| 2011/0031569 A1* | 2/2011 | Watts | B82Y 25/00 257/421 |
| 2011/0096443 A1 | 4/2011 | Zhang et al. | |
| 2011/0102948 A1* | 5/2011 | Apalkov | G11C 11/16 360/324.2 |
| 2011/0171493 A1 | 7/2011 | Worledge et al. | |
| 2011/0227179 A1 | 9/2011 | Kitagawa et al. | |

(Continued)

*Primary Examiner* — Chuong A Luu
(74) *Attorney, Agent, or Firm* — Bing K. Yen

(57) ABSTRACT

The present invention is directed to an MTJ memory element, which includes a magnetic free layer structure having a variable magnetization direction perpendicular to a layer plane thereof; a tunnel junction layer formed adjacent to the magnetic free layer structure; a magnetic reference layer structure formed adjacent to the tunnel junction layer and having a first invariable magnetization direction perpendicular to a layer plane thereof; an anti-ferromagnetic coupling layer formed adjacent to the magnetic reference layer structure; and a magnetic fixed layer structure formed adjacent to the anti-ferromagnetic coupling layer and having a second invariable magnetization direction that is perpendicular to a layer plane thereof and is opposite to the first invariable magnetization direction. The magnetic fixed layer structure includes multiple stacks of a trilayer unit structure, which includes three layers of different materials with at least one of the three layers of different materials being magnetic.

17 Claims, 11 Drawing Sheets

(56) References Cited

U.S. PATENT DOCUMENTS

| | | | |
|---|---|---|---|
| 2011/0293967 A1* | 12/2011 | Zhang | G11B 5/66 428/827 |
| 2012/0012953 A1 | 1/2012 | Lottis et al. | |
| 2015/0325783 A1* | 11/2015 | Wang | H01F 10/3286 257/421 |
| 2017/0110650 A1* | 4/2017 | Park | H01L 43/02 |

* cited by examiner

PERPENDICULAR MAGNETIC FIXED LAYER WITH HIGH ANISOTROPY

This application is continuation-in-part of application Ser. No. 15/295,002, filed on Oct. 17, 2016, now U.S. Pat. No. 9,793,319, which is a continuation of application Ser. No. 14/687,161, filed on Apr. 15, 2015, now U.S. Pat. No. 9,496,489.

BACKGROUND

The present invention relates to a magnetic random access memory (MRAM) device, and more particularly, to a magnetic memory element including a perpendicular magnetic fixed layer with high anisotropy.

Spin transfer torque magnetic random access memory (STT-MRAM) is a new class of non-volatile memory, which can retain the stored information when powered off. An STT-MRAM device normally comprises an array of memory cells, each of which includes at least a magnetic memory element and a selection element coupled in series between appropriate electrodes. Upon application of a switching current to the magnetic memory element, the electrical resistance of the magnetic memory element would change accordingly, thereby switching the stored logic in the respective memory cell.

FIG. 1 shows a conventional memory element for an STT-MRAM device comprising a magnetic reference layer 50 and a magnetic free layer 52 with an insulating tunnel junction layer 54 interposed therebetween, thereby collectively forming a magnetic tunneling junction (MTJ) 56. The magnetic reference layer 50 and free layer 52 have magnetization directions 58 and 60, respectively, which are substantially perpendicular to the layer planes. Therefore, the MTJ 56 is a perpendicular type comprising the magnetic layers 50 and 52 with perpendicular anisotropy. Upon application of a switching current to the perpendicular MTJ 56, the magnetization direction 60 of the magnetic free layer 52 can be switched between two directions: parallel and anti-parallel with respect to the magnetization direction 58 of the magnetic reference layer 50. The insulating tunnel junction layer 54 is normally made of a dielectric material with a thickness ranging from a few to a few tens of angstroms. When the magnetization directions 60 and 58 of the magnetic free layer 52 and reference layer 50 are substantially parallel, electrons polarized by the magnetic reference layer 50 can tunnel through the insulating tunnel junction layer 54, thereby decreasing the electrical resistance of the perpendicular MTJ 56. Conversely, the electrical resistance of the perpendicular MTJ 56 is high when the magnetization directions 58 and 60 of the magnetic reference layer 50 and free layer 52 are substantially anti-parallel. Accordingly, the stored logic in the magnetic memory element can be switched by changing the magnetization direction 60 of the magnetic free layer 52.

One of many advantages of STT-MRAIVI over other types of non-volatile memories is scalability. As the size of the perpendicular MTJ 56 is reduced, however, the thermal stability of the magnetic layers 50 and 52, which is required for long term data retention, also degrades with miniaturization of the perpendicular MTJ 56. While the thermal stability of the perpendicular MTJ 56 may be improved by increasing the coercivity of the magnetic free layer 52, doing so would adversely increase the current required to switch the magnetization direction 60 of the magnetic free layer 52.

For the foregoing reasons, there is a need for an MRAM device that has a thermally stable perpendicular MTJ memory element which can be programmed with a low switching current.

SUMMARY

The present invention is directed to a memory element that satisfies this need. An MTJ memory element having features of the present invention comprises a magnetic free layer structure including one or more magnetic free layers that have a variable magnetization direction substantially perpendicular to layer planes thereof; an insulating tunnel junction layer formed adjacent to the magnetic free layer structure; a magnetic reference layer structure formed adjacent to the insulating tunnel junction layer opposite the magnetic free layer structure, the magnetic reference layer structure including one or more magnetic reference layers that have a first invariable magnetization direction substantially perpendicular to layer planes thereof; an anti-ferromagnetic coupling layer formed adjacent to the magnetic reference layer structure opposite the insulating tunnel junction layer; and a magnetic fixed layer structure formed adjacent to the anti-ferromagnetic coupling layer opposite the magnetic reference layer structure, the magnetic fixed layer structure having a second invariable magnetization direction that is substantially perpendicular to a layer plane thereof and is substantially opposite to the first invariable magnetization direction. The magnetic fixed layer structure includes multiple stacks of a trilayer unit structure formed adjacent to each other, the trilayer unit structure including three layers of different materials with at least one of the three layers of different materials being magnetic.

According to another aspect of the present invention, a magnetic structure comprises a seed layer, and a magnetic fixed layer structure formed adjacent to the seed layer and having a first invariable magnetization direction substantially perpendicular to a layer plane thereof. The magnetic fixed layer structure includes multiple stacks of a trilayer unit structure formed adjacent to each other, the trilayer unit structure including three layers of different materials with at least one of the three layers of different materials being magnetic. The trilayer unit structure may include a layer of cobalt, a layer of chromium, and a layer of nickel.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

Figure 1:
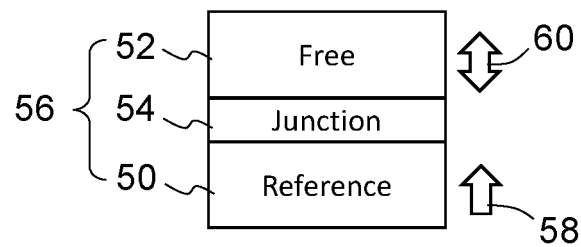
FIG. 1 is a cross-sectional view of a conventional magnetic tunnel junction.

In the Summary above and in the Detailed Description, and the claims below, and in the accompanying drawings, reference is made to particular features (including method steps) of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a material AB composed of element A and element B, the material AB can be an alloy, a compound, or a combination thereof, except where the context excludes that possibility.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

The term "superlattice" means a synthetic periodic structure formed by interleaving layers of at least two constituent materials. A superlattice has at least two repeated unit stacks with each unit stack formed by laminating the constituent materials. Because of the periodic nature of its structure, a superlattice may exhibit characteristic satellite peaks when analyzed by diffraction methods, such as X-ray diffraction and neutron diffraction. For example, a $[Co/Pt]_n$ superlattice would denote a structure formed by n stacks of the bilayer structure of cobalt (Co) and platinum (Pt).

The term "magnetic dead layer" means a layer of supposedly ferromagnetic material that does not exhibit a net magnetic moment in the absence of an external magnetic field. A magnetic dead layer of several atomic layers may form in a magnetic film in contact with another layer material owing to intermixing of atoms at the interface. Alternatively, a magnetic dead layer may form as thickness of a magnetic film decreases to a point that the magnetic film becomes superparamagnetic.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)–(a second number)," this means a range whose lower limit is the first number and whose upper limit is the second number. For example, "25 to 100 nm" means a range whose lower limit is 25 nm and whose upper limit is 100 nm.

Directional terms, such as "front," "back," "top," "bottom," and the like, may be used with reference to the orientation of the illustrated figure. Spatially relative terms, such as "beneath," "below," "under," "lower," "upper," "above," etc., may be used herein to describe one element's relationship to another element(s) as illustrated in the figure. Since articles and elements can be positioned in a number of different orientations, these terms are intended for illustration purposes and in no way limit the invention.

Figure 2:
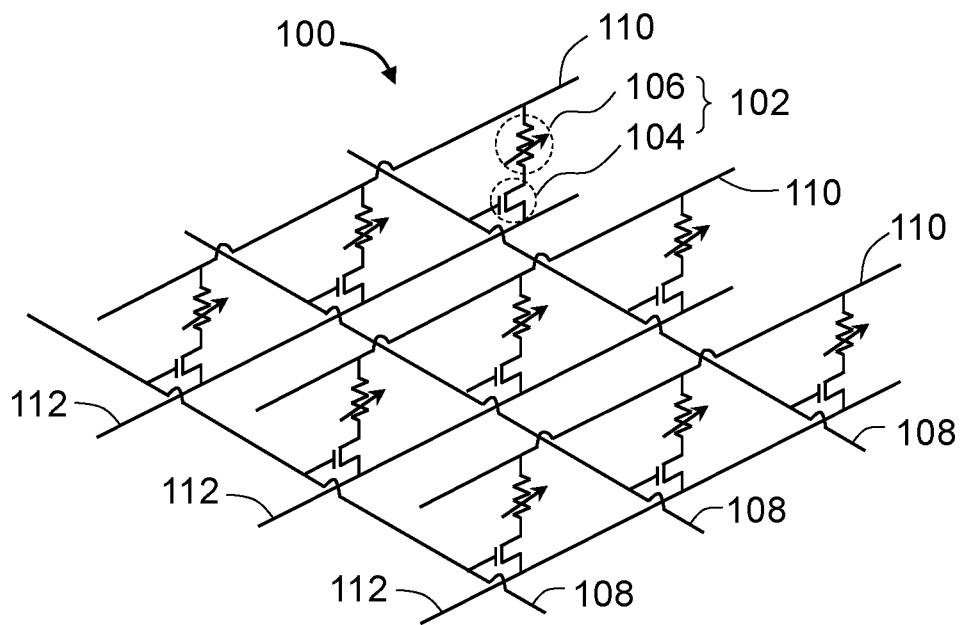
FIG. 2 is a schematic circuit diagram of an MRAM array in accordance with an embodiment of the present invention.

FIG. 2 is a schematic circuit diagram of an MRAM array 100 in accordance with an embodiment of the present invention. The MRAM array 100 comprises a plurality of memory cells 102, each of the memory cells 102 including a selection transistor 104 coupled to an MTJ memory element 106; a plurality of parallel word lines 108 with each being coupled to gates of a respective row of the selection transistors 104 in a first direction; and a plurality of parallel bit lines 110 with each being coupled to a respective row of the MTJ memory elements 106 in a second direction substantially perpendicular to the first direction; and optionally a plurality of parallel source lines 112 with each being coupled to sources or drains of a respective row of the selection transistors 104 in the first or second direction. The MTJ memory element 106 has a perpendicular MTJ structure that includes multiple magnetic layers having magnetizations directions substantially perpendicular to layer planes thereof.

Figure 3:
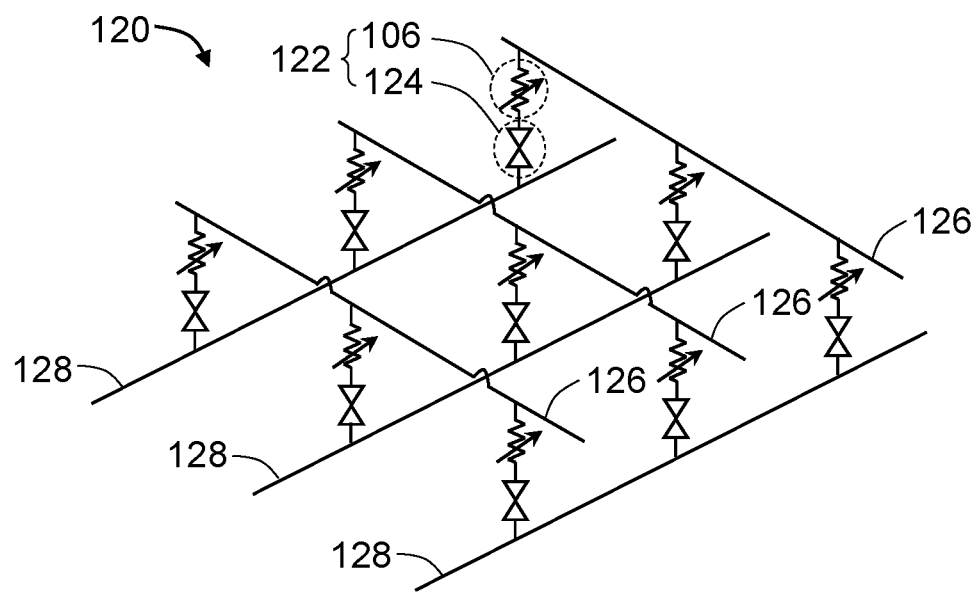
FIG. 3 is a schematic circuit diagram of an MRAM array in accordance with another embodiment of the present invention.

FIG. 3 is a schematic circuit diagram of an MRAM array 120 in accordance with another embodiment of the present invention. The MRAM array 120 comprises a plurality of memory cells 122 with each of the memory cells 122 including a two-terminal selector 124 coupled to an MTJ memory element 106 in series; a first plurality of parallel wiring lines 126 with each being coupled to a respective row of the MTJ memory elements 106 in a first direction; and a second plurality of parallel wiring lines 128 with each being coupled to a respective row of the selectors 124 in a second direction substantially perpendicular to the first direction. Accordingly, the memory cells 122 are located at the cross points between the first and second plurality of wiring lines 126 and 128. The first and second plurality of wiring lines 126 and 128 may be word lines and bit lines, respectively, or vice versa. The MTJ memory element 106 may have a perpendicular MTJ structure that includes multiple magnetic layers having magnetizations directions substantially perpendicular to layer planes thereof. Multiple layers of the memory array 120 may be stacked to form a monolithic three-dimensional memory device. While the MTJ memory element 106 is shown to form above the two-terminal selector 124 in FIG. 3, the stacking order may reversed.

Figure 4A:
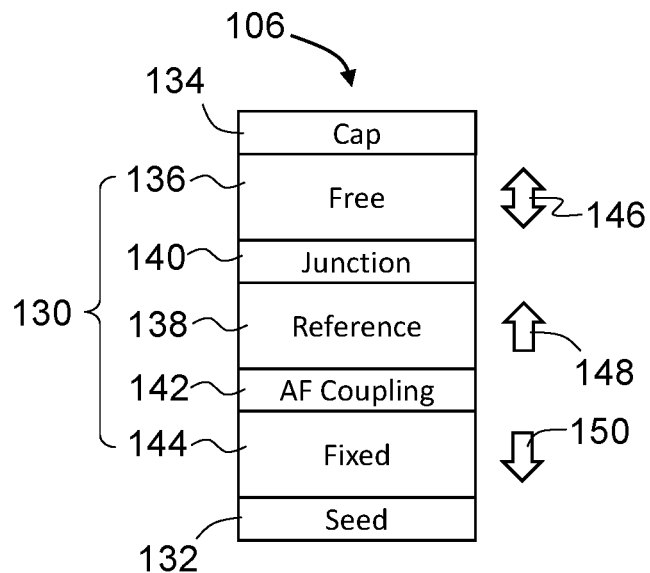
FIGS. 4A and 4B are cross-sectional views of MTJ memory elements in accordance with an embodiment of the present invention.

An embodiment of the present invention as applied to the MTJ memory element 106 will now be described with reference to FIG. 4A. Referring now to FIG. 4A, the illustrated perpendicular MTJ memory element 106 includes a magnetic tunnel junction (MTJ) structure 130 in between an optional seed layer 132 and an optional cap layer 134. The MTJ structure 130 comprises a magnetic free layer structure 136 and a magnetic reference layer structure 138 with an insulating tunnel junction layer 140 interposed therebetween, an anti-ferromagnetic coupling layer 142 formed adjacent to the magnetic reference layer structure 138 opposite the insulating tunnel junction layer 140, and a magnetic fixed layer structure 144 formed adjacent to the anti-ferromagnetic coupling layer 142 opposite the magnetic reference layer structure 138. Therefore, the magnetic fixed layer structure 144 is anti-ferromagnetically exchange coupled to the magnetic reference layer structure 138 via the anti-ferromagnetic coupling layer 142. The magnetic fixed layer structure 144 and the magnetic free layer structure 136 may be formed adjacent to the optional seed layer 132 and cap layer 134, respectively. Additional layers, magnetic or non-magnetic, may form between the magnetic fixed layer structure 144 and the optional seed layer 132 and/or between the magnetic free layer structure 136 and the optional cap layer 134.

The magnetic free layer structure 136 has a variable magnetization direction 146 substantially perpendicular to a layer plane thereof. The magnetic reference layer structure 138 has a first invariable magnetization direction 148 substantially perpendicular to a layer plane thereof. The magnetic fixed layer structure 144 has a second invariable magnetization direction 150 that is substantially perpendicular to a layer plane thereof and is substantially opposite to the first invariable magnetization direction 148.

Figure 4B:
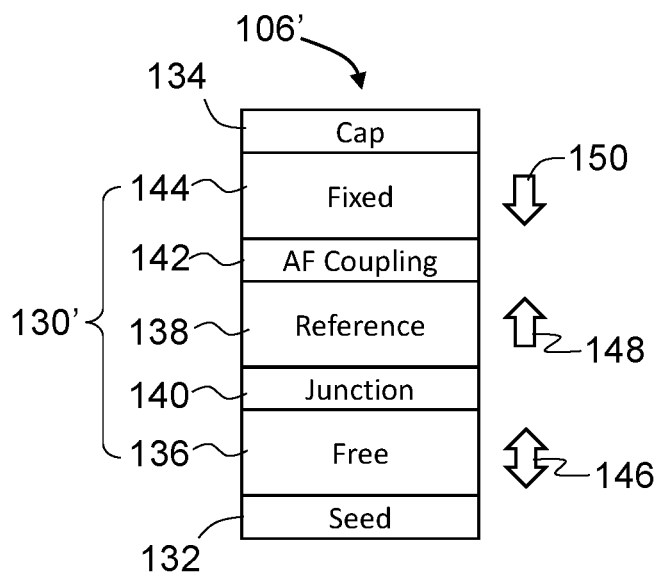

The stacking order of the individual layers 136-144 in the MTJ structure 130 of the memory element 106 may be inverted as illustrated in FIG. 4B. The memory element 106' of FIG. 4B includes an MTJ structure 130' that has the same layers but with the inverted stacking order comparing to the MTJ structure 130. Accordingly, the magnetic free layer structure 136 and the magnetic fixed layer structure 144 may be formed adjacent to the optional seed layer 132 and cap layer 134, respectively.

Figure 5A:
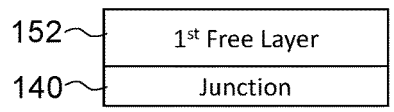
FIGS. 5A-5G are cross-sectional views of exemplary magnetic free layer structures in accordance with an embodiment of the present invention.

The magnetic free layer structure 136 may include one or more magnetic layers with each layer having the variable magnetization direction 146 as illustrated by the exemplary embodiments shown in FIGS. 5A-5G. FIG. 5A shows that the magnetic free layer structure 136 includes a first magnetic free layer 152, which has the variable magnetization direction 146, formed adjacent to the tunnel junction layer 140.

Figure 5B:
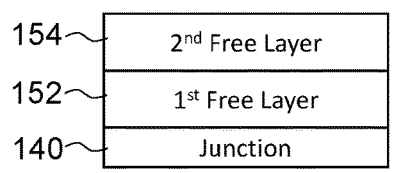
Figure 5E:
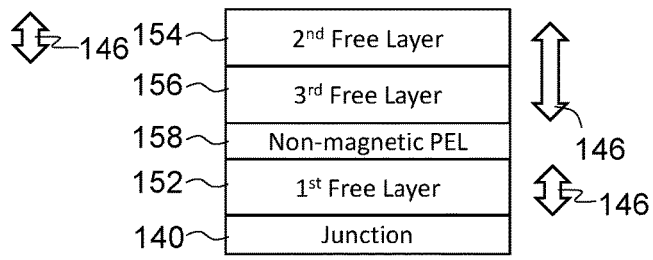

FIG. 5B shows the magnetic free layer structure 136 including a first magnetic free layer 152 formed adjacent to the tunnel junction layer 140 and a second magnetic free layer 154 formed adjacent to the first magnetic free layer 152 opposite the tunnel junction layer 140. Each of the first and second magnetic free layers 152 and 154 has the variable magnetization direction 146. The exemplary magnetic free layer structure of FIG. 5B may further include a non-magnetic perpendicular enhancement layer (PEL) 158 interposed between the first and second magnetic free layers 152 and 154 as illustrated in FIG. 5D.

Figure 5C:
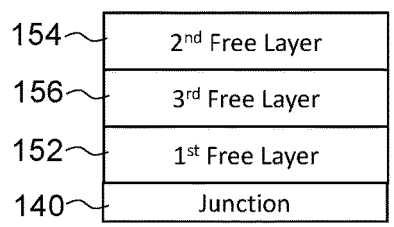

The magnetic free layer structure 136 may include three magnetic free layers 152-156 as illustrated in FIG. 5C. A first magnetic free layer 152 is formed adjacent to the tunnel junction layer 140. A third magnetic free layer 156 is formed adjacent to the first magnetic free layer 152 opposite the tunnel junction layer 140. A second magnetic free layer 154 is formed adjacent to the third magnetic free layer 156 opposite the first magnetic free layer 152. Each of the first, second, and third magnetic free layers 152-156 has the variable magnetization direction 146.

Figure 5F:
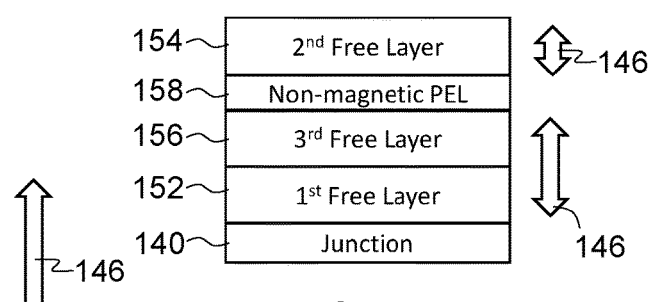
Figure 5D:
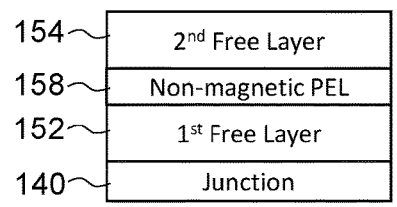
Figure 5G:
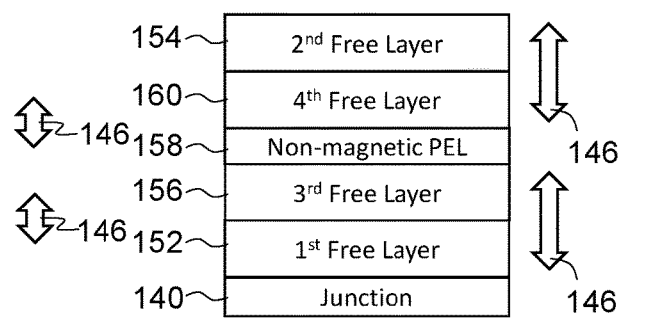

The exemplary magnetic free layer structure of FIG. 5C may further include a non-magnetic perpendicular enhancement layer (PEL) 158 interposed between the first and third magnetic free layers 152 and 156 as illustrated in FIG. 5E. Alternatively, the exemplary magnetic free layer structure of FIG. 5C may further include a non-magnetic perpendicular enhancement layer (PEL) 158 interposed between the second and third magnetic free layers 154 and 156 as illustrated in FIG. 5F. The exemplary magnetic free layer structure of FIG. 5F may be further modified to include a fourth magnetic free layer 160, which has the variable magnetization direction 146, interposed between the non-magnetic PEL 158 and the second magnetic free layer 154 as illustrated in FIG. 5G.

The exemplary magnetic free layer structures of FIG. 5A-5G may be formed above the tunnel junction layer 140 as shown in FIG. 4A, or beneath the tunnel junction layer 140 as shown in FIG. 4B. In the latter case, the stacking sequence of the layers in the exemplary magnetic free layer structures of FIG. 5A-5G will be inverted.

The magnetic free layer structure 136 is not limited to the exemplary structures of FIGS. 5A-5G and may have other structures that include multiple magnetic free layers and optionally one or more PELs. For example, the magnetic free layer structure 136 may include four magnetic free layers without any PEL.

Figure 6A:
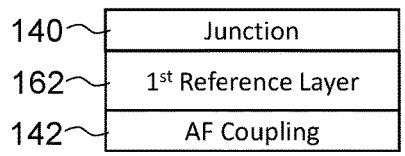
FIGS. 6A-6G are cross-sectional views of exemplary magnetic reference layer structures in accordance with an embodiment of the present invention.

The magnetic reference layer structure 138 may include one or more magnetic layers with each layer having the first invariable magnetization direction 148 as illustrated by the exemplary embodiments shown in FIGS. 6A-6G. FIG. 6A shows that the magnetic reference layer structure 138 includes a first magnetic reference layer 162, which has the first invariable magnetization direction 148, formed between the tunnel junction layer 140 and the anti-ferromagnetic coupling layer 142.

Figure 6E:
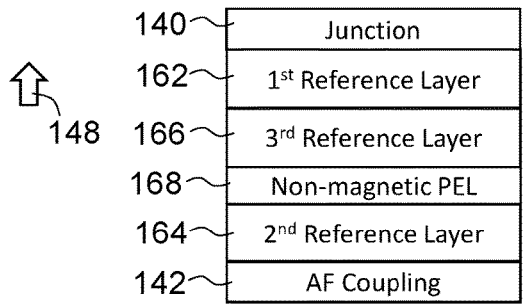
Figure 6B:
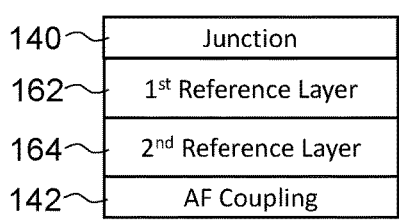

FIG. 6B shows the magnetic reference layer structure 138 including a first magnetic reference layer 162 formed adjacent to the tunnel junction layer 140 and a second magnetic reference layer 164 formed adjacent to the first magnetic reference layer 162 opposite the tunnel junction layer 140. The anti-ferromagnetic coupling layer 142 is formed adjacent to the second magnetic reference layer 164 opposite the first magnetic reference layer 162. Each of the first and second magnetic reference layers 162 and 164 has the first invariable magnetization direction 148. The exemplary magnetic reference layer structure of FIG. 6B may further include a non-magnetic perpendicular enhancement layer (PEL) 168 interposed between the first and second magnetic reference layers 162 and 164 as illustrated in FIG. 6D.

Figure 6C:
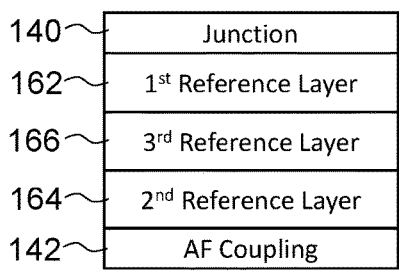

The magnetic reference layer structure 138 may include three magnetic reference layers 162-166 as illustrated in FIG. 6C. A first magnetic reference layer 162 is formed adjacent to the tunnel junction layer 140. A third magnetic reference layer 166 is formed adjacent to the first magnetic reference layer 162 opposite the tunnel junction layer 140. A second magnetic reference layer 164 is formed adjacent to the third magnetic reference layer 166 opposite the first magnetic reference layer 162. The anti-ferromagnetic coupling layer 142 is formed adjacent to the second magnetic reference layer 164 opposite the third magnetic reference layer 166. Each of the first, second, and third magnetic reference layers 162-166 has the first invariable magnetization direction 148.

Figure 6F:
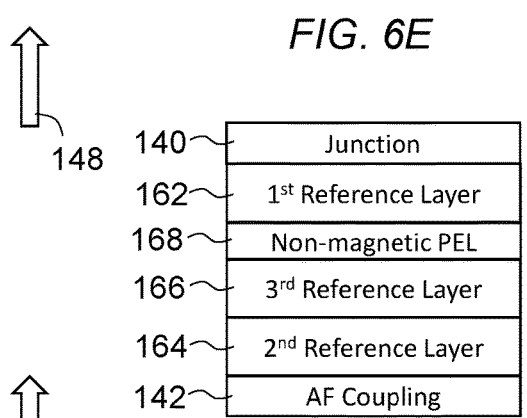
Figure 6D:
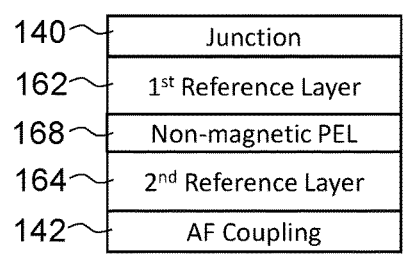
Figure 6G:
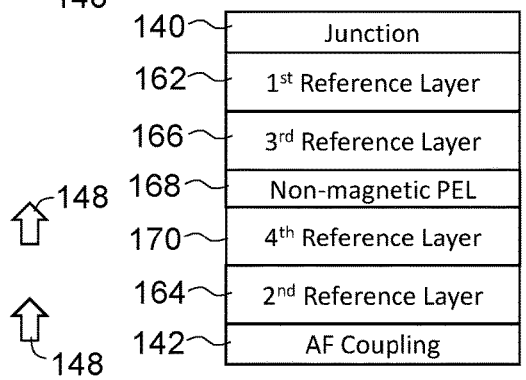

The exemplary magnetic reference layer structure of FIG. 6C may further include a non-magnetic perpendicular enhancement layer (PEL) 168 interposed between the first and third magnetic reference layers 162 and 166 as illustrated in FIG. 6F. Alternatively, the exemplary magnetic reference layer structure of FIG. 6C may further include a non-magnetic perpendicular enhancement layer (PEL) 168 interposed between the second and third magnetic reference layers 164 and 166 as illustrated in FIG. 6E. The exemplary magnetic reference layer structure of FIG. 6E may be further modified to include a fourth magnetic reference layer 170, which has the first invariable magnetization direction 148, interposed between the non-magnetic PEL 168 and the second magnetic reference layer 164 as illustrated in FIG. 6G.

The exemplary magnetic reference layer structures of FIG. 6A-6G may be formed beneath the tunnel junction layer 140 as shown in FIG. 4A, or above the tunnel junction layer 140 as shown in FIG. 4B. In the latter case, the stacking sequence of the layers in the exemplary magnetic reference layer structures of FIG. 6A-6G will be inverted.

The magnetic reference layer structure 138 is not limited to the exemplary structures of FIGS. 6A-6G and may have other structures that include multiple magnetic reference layers and optionally one or more PELs. For example, the magnetic reference layer structure 138 may include four magnetic reference layers without any PEL.

Figure 7A:
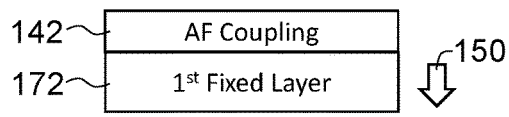
FIGS. 7A-7G are cross-sectional views of exemplary magnetic fixed layer structures in accordance with an embodiment of the present invention.

The magnetic fixed layer structure 144 may include one or more magnetic layers with each layer having the second invariable magnetization direction 150 as illustrated by the exemplary embodiments shown in FIGS. 7A-7G. FIG. 7A shows that the magnetic fixed layer structure 144 includes a first magnetic fixed layer 172, which has the second invariable magnetization direction 150, formed adjacent to the anti-ferromagnetic coupling layer 142.

Figure 7E:
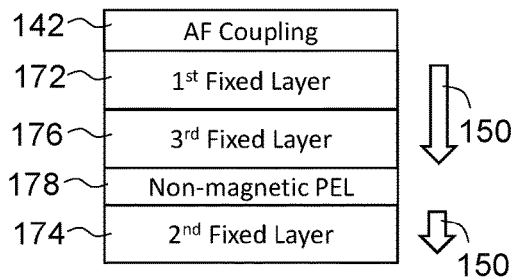
Figure 7B:
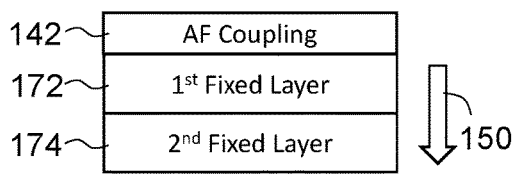

FIG. 7B shows the magnetic fixed layer structure 144 including a first magnetic fixed layer 172 formed adjacent to the anti-ferromagnetic coupling layer 142 and a second magnetic fixed layer 174 formed adjacent to the first magnetic fixed layer 172 opposite the anti-ferromagnetic coupling layer 142. Each of the first and second magnetic fixed layers 172 and 174 has the second invariable magnetization direction 150. The exemplary magnetic fixed layer structure of FIG. 7B may further include a non-magnetic perpendicular enhancement layer (PEL) 178 interposed between the first and second magnetic fixed layers 172 and 174 as illustrated in FIG. 7D.

Figure 7C:
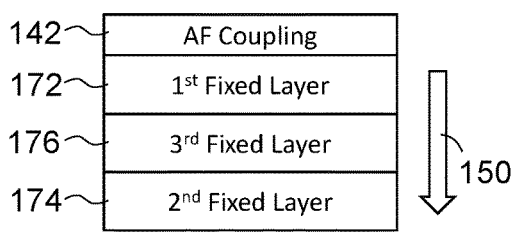

The magnetic fixed layer structure 144 may include three magnetic fixed layers 172-176 as illustrated in FIG. 7C. A first magnetic fixed layer 172 is formed adjacent to the anti-ferromagnetic coupling layer 142. A third magnetic fixed layer 176 is formed adjacent to the first magnetic fixed layer 172 opposite the anti-ferromagnetic coupling layer 142. A second magnetic fixed layer 174 is formed adjacent to the third magnetic fixed layer 176 opposite the first magnetic fixed layer 172. Each of the first, second, and third magnetic fixed layers 172-176 has the second invariable magnetization direction 150.

Figure 7F:
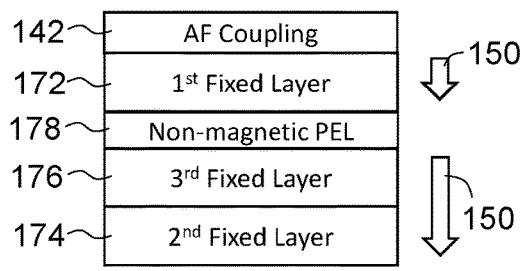
Figure 7D:
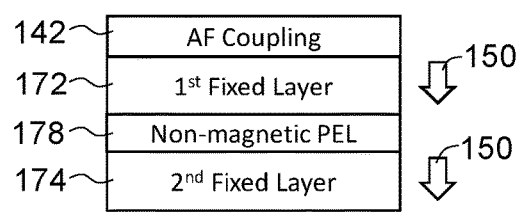
Figure 7G:
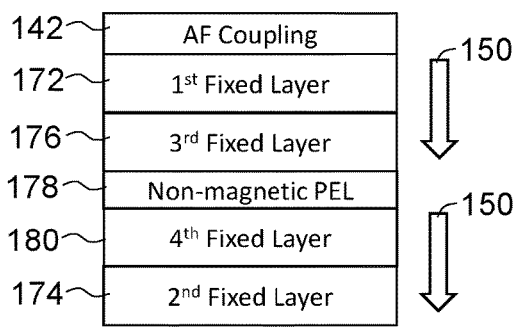

The exemplary magnetic fixed layer structure of FIG. 7C may further include a non-magnetic perpendicular enhancement layer (PEL) 178 interposed between the first and third magnetic fixed layers 172 and 176 as illustrated in FIG. 7F. Alternatively, the exemplary magnetic fixed layer structure of FIG. 7C may further include a non-magnetic perpendicular enhancement layer (PEL) 178 interposed between the second and third magnetic fixed layers 174 and 176 as illustrated in FIG. 7E. The exemplary magnetic fixed layer structure of FIG. 7E may be further modified to include a fourth magnetic fixed layer 180, which has the second invariable magnetization direction 150, interposed between the non-magnetic PEL 178 and the second magnetic fixed layer 174 as illustrated in FIG. 7G.

The exemplary magnetic fixed layer structures of FIG. 7A-7G may be formed beneath the anti-ferromagnetic coupling layer 142 as shown in FIG. 4A, or above the anti-ferromagnetic coupling layer 142 as shown in FIG. 4B. In the latter case, the stacking sequence of the layers in the exemplary magnetic fixed layer structures of FIG. 7A-7G will be inverted.

The magnetic fixed layer structure 144 is not limited to the exemplary structures of FIGS. 7A-7G and may have other structures that include multiple magnetic fixed layers and optionally one or more PELs. For example, the magnetic fixed layer structure 144 may include four magnetic fixed layers without any PEL.

The magnetic layers 152-156, 160-166, 170-176, and 180 may be made of any suitable magnetic materials or structures. One or more of the magnetic layers 152-156, 160-166, 170-176, and 180 may comprise one or more ferromagnetic elements, such as but not limited to cobalt (Co), nickel (Ni), and iron (Fe), to form a suitable magnetic material, such as but not limited to Co, Ni, Fe, CoNi, CoFe, NiFe, or CoNiFe. The suitable magnetic material for the one or more of the magnetic layers 152-156, 160-166, 170-176, and 180 may further include one or more non-magnetic elements, such as but not limited to boron (B), titanium (Ti), zirconium (Zr), hafnium (Hf), vanadium (V), niobium (Nb), tantalum (Ta), chromium (Cr), molybdenum (Mo), tungsten (W), aluminum (Al), silicon (Si), germanium (Ge), gallium (Ga), oxygen (O), nitrogen (N), carbon (C), platinum (Pt), palladium (Pd), ruthenium (Ru), samarium (Sm), neodymium (Nd), antimony (Sb), iridium (Ir) or phosphorus (P), to form a magnetic alloy or compound, such as but not limited to cobalt-iron-boron (CoFeB), iron-platinum (FePt), cobalt-platinum (CoPt), cobalt-platinum-chromium (CoPtCr), cobalt-iron-boron-titanium (CoFeBTi), cobalt-iron-boron-zirconium, (CoFeBZr), cobalt-iron-boron-hafnium (CoFeBHf), cobalt-iron-boron-vanadium (CoFeBV), cobalt-iron-boron-tantalum (CoFeBTa), cobalt-iron-boron-chromium (CoFeBCr), cobalt-iron-titanium (CoFeTi), cobalt-iron-zirconium (CoFeZr), cobalt-iron-hafnium (CoFeHf), cobalt-iron-vanadium (CoFeV), cobalt-iron-niobium (CoFeNb), cobalt-iron-tantalum (CoFeTa), cobalt-iron-chromium (CoFeCr), cobalt-iron-molybdenum (CoFeMo), cobalt-iron-tungsten (CoFeW), cobalt-iron-aluminum (CoFeAl), cobalt-iron-silicon (CoFeSi), cobalt-iron-germanium (CoFeGe), iron-zirconium-boron (FeZrB), samarium-cobalt (SmCo), neodymium-iron-boron (NdFeB), cobalt-iron-antimony (CoFeSb), cobalt-iron-iridium (CoFeIr), or cobalt-iron-phosphorous (CoFeP).

Some of the above-mentioned magnetic materials, such as Fe, CoFe, CoFeB may have a body-centered cubic (BCC) lattice structure that is compatible with the halite-like cubic lattice structure of MgO, which may be used as the insulating tunnel junction layer 140. CoFeB alloy used for one or more of the magnetic layers 152-156, 160-166, 170-176, and 180 may contain more than 40 atomic percent Fe or may contain less than 30 atomic percent B or both.

Figure 8A:
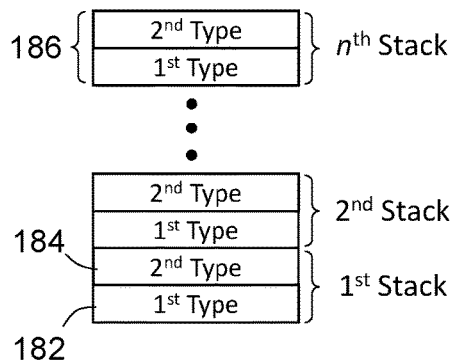
FIGS. 8A-8D are cross-sectional views of exemplary multilayer structures comprising one or more stacks of a bilayer unit structure.
Figure 8B:
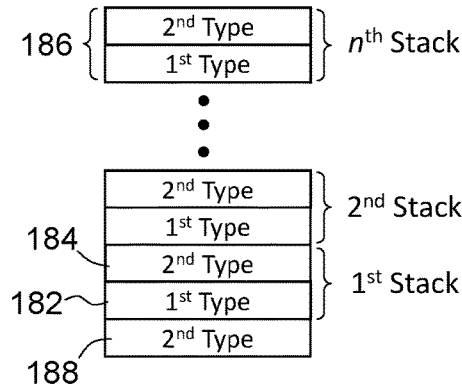
Figure 8C:
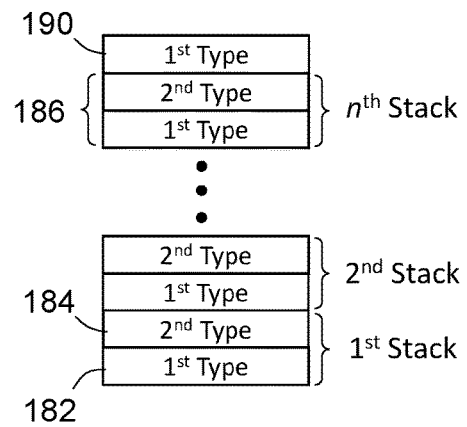
Figure 8D:
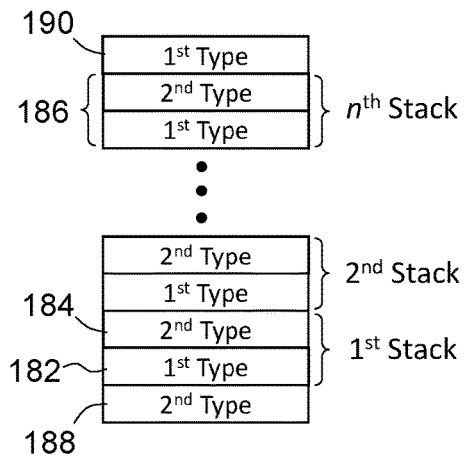

One or more of the magnetic layers 152-156, 160-166, 170-176, and 180 may alternatively have a multilayer structure formed by interleaving one or more layers of a first type of material 182 with one or more layers of a second type of material 184 with at least one of the two types of materials being magnetic, as illustrated in FIGS. 8A-8D. FIG. 8A shows an exemplary multilayer structure formed by one (n=1) or more stacks of a bilayer unit structure 186, which includes a layer of the first type of material 182 and a layer of the second type of material 184. The multilayer structure for one or more of the magnetic layers 152-156, 160-166, 170-176, and 180 may include additional layers formed at the periphery of the exemplary multilayer structure of FIG. 8A. For example, the stacks of the bilayer unit structure 186 may include another layer of the second type of material 188 formed adjacent to the first type of material of the first stack as shown in FIG. 8B, or another layer of the first type of material 190 formed adjacent to the second type of material of the $n^{th}$ stack (the end stack) as shown in FIG. 8C, or both as shown in FIG. 8D. The layer of the first type of material 182 in a stack 186 may have a different thickness compared with other layers of the first type of material in other stacks. Similarly, the layer of the second type of material 184 in a stack 186 may have a different thickness compared with other layers of the second type of material in other stacks. The layer thicknesses of the first type of material 190 and the second type of material 188 at the periphery may or may not be same as the layer thicknesses of the first type of material 182 and the second type of material 184 of the bilayer unit structure 186, respectively. One or more layers of the two layers of materials 182-184 may be extremely thin and thus have fragmented coverage and/or are perforated with holes. The stacking sequences of the exemplary multilayer structures of FIGS. 8A-8D may be inverted.

The first type of material 182 and 190 may comprise one or more ferromagnetic elements, such as but not limited to cobalt (Co), nickel (Ni), and iron (Fe), to form a suitable magnetic material, such as but not limited to Co, Ni, Fe, CoNi, CoFe, NiFe, or CoNiFe. The second type of material 184 and 188 may be made of any suitable material, such as but not limited to Pt, Pd, Ni, Ir, Cr, V, Ti, Zr, Hf, Nb, Ta, Mo, W, NiCr, NiV, NiTi, NiZr, NiHf, NiNb, NiTa, NiMo, NiW, or any combination thereof. Therefore, one or more of the magnetic layers 152-156, 160-166, 170-176, and 180 may include a multilayer structure, such as but not limited to [Co/Pt], [Co/Pd], [Co/Pt(Pd)], [Co/Ni], [Co/Ir], [CoFe/Pt], [CoFe/Pd], [CoFe/Pt(Pd)], [CoFe/Ni], [CoFe/Ir], [Co/NiCr], or any combination thereof. The multilayer structure may have a face-centered cubic (FCC) type of lattice structure, which is different from the body-centered cubic structure (BCC) of some ferromagnetic materials, such as Fe, CoFe, and CoFeB, and the halite-like cubic lattice structure of magnesium oxide (MgO) that may be used as the insulating tunnel junction layer 140. All individual magnetic layers of a magnetic multilayer structure may have the same magnetization direction. The multilayer structure may or may not exhibit the characteristic satellite peaks associated with superlattice when analyzed by X-ray, neutron diffraction, or other diffraction techniques.

Figure 9A:
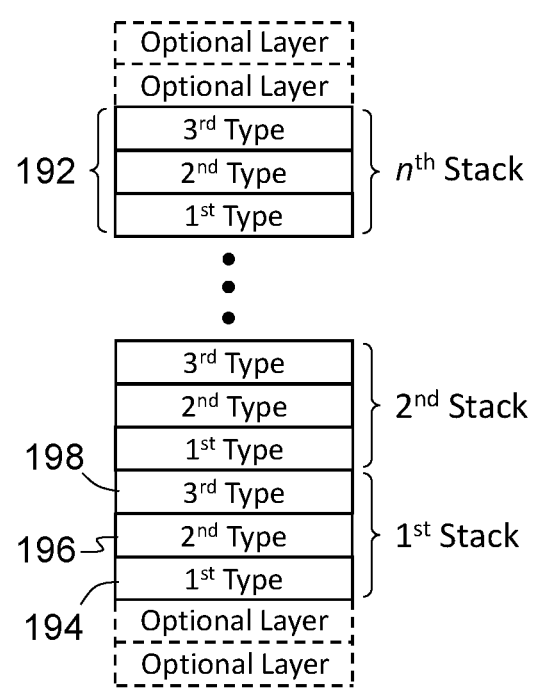
FIGS. 9A-9I are cross-sectional views of exemplary multilayer structures comprising one or more stacks of a trilayer unit structure.
Figure 9B:
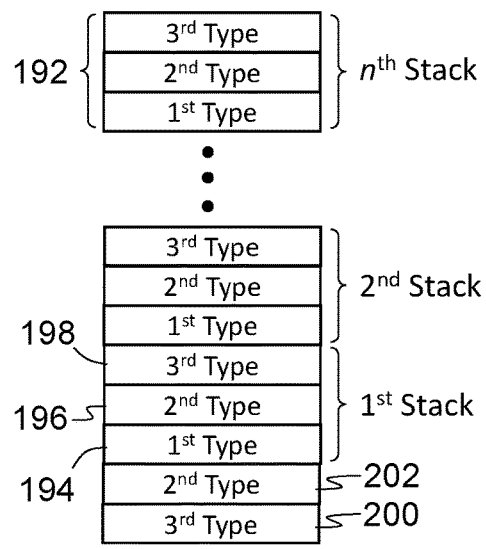
Figure 9D:
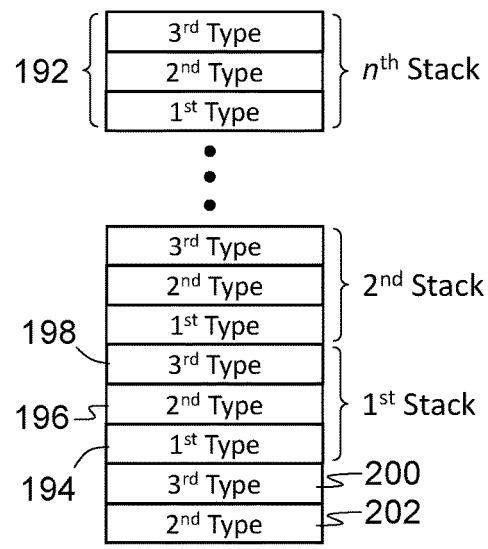
Figure 9C:
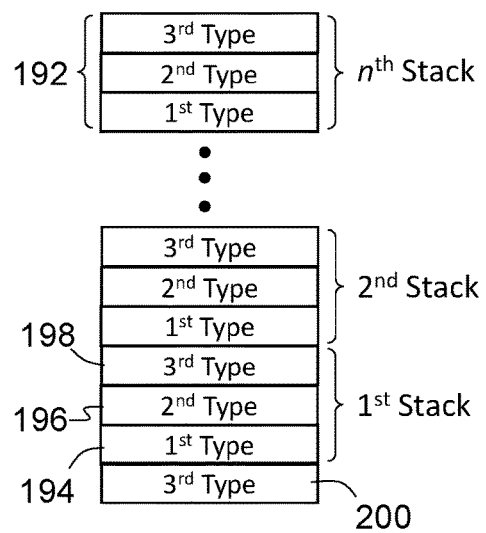
Figure 9E:
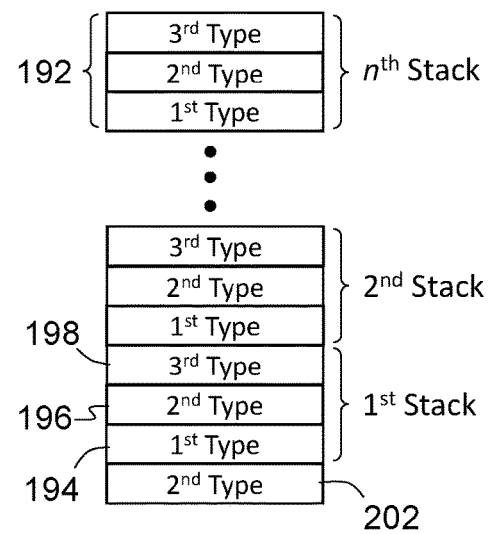

One or more of the magnetic layers 152-156, 160-166, 170-176, and 180 may alternatively have a multilayer structure formed by one (n=1) or more stacks of a trilayer unit structure 192 as illustrated in FIG. 9A. Each trilayer unit structure 192 includes a layer of a first type of material 194 and a layer of a third type of material 198 with a layer of a second type of material 196 interposed therebetween. At least one of the three types of materials 194-198 is magnetic. The multilayer structure of FIG. 9A may include one or more additional layers formed adjacent to the first stack and/or the $n^{th}$ stack thereof. FIGS. 9B-9E show some exemplary structures in which one or more additional layers are formed adjacent to the first stack. The exemplary structures of FIGS. 9C and 9E respectively show that a layer of the third type of material 200 and a layer of the second type of material 202 may form adjacent to the layer of the first type of material 194 of the first stack. The exemplary structure of FIG. 9C may further include a layer of the second type of material 202 formed adjacent to the layer of the third type of material 200 opposite the first stack as shown in FIG. 9D. Similarly, the exemplary structure of FIG. 9E may further include a layer of the third type of material 200 formed adjacent to the layer of the second type of material 202 opposite the first stack as shown in FIG. 9B.

Figure 9F:
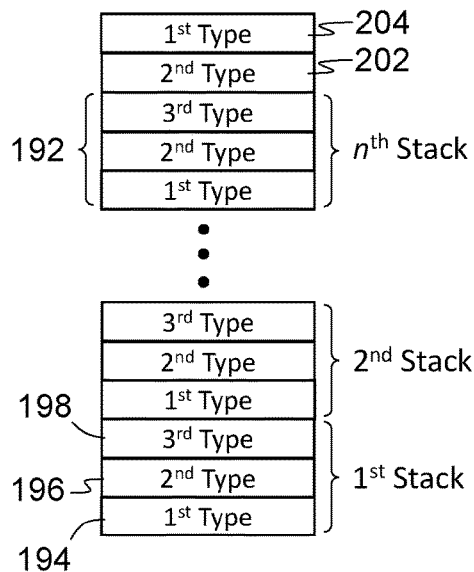
Figure 9H:
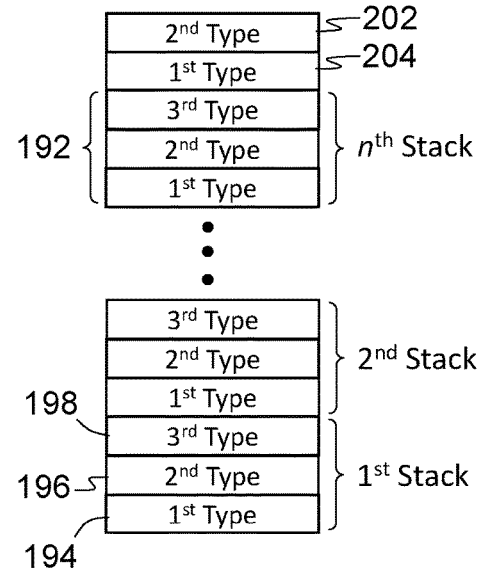
Figure 9G:
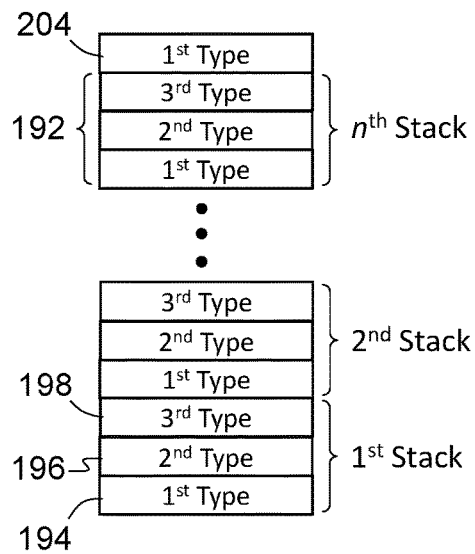
Figure 9I:
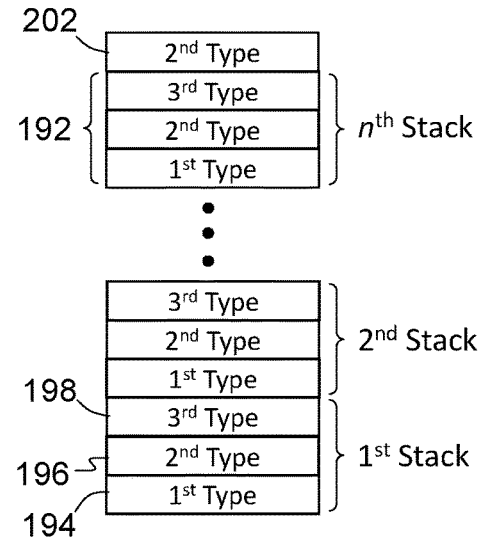

FIGS. 9F-9I show some exemplary structures in which one or more additional layers are formed adjacent to the $n^{th}$ stack. The exemplary structures of FIGS. 9G and 9I respectively show that a layer of the first type of material 204 and a layer of the second type of material 202 may form adjacent to the third type of material 198 of the $n^{th}$ stack. The exemplary structure of FIG. 9G may further include a layer of the second type of material 202 formed adjacent to the layer of the first type of material 204 opposite the $n^{th}$ stack as shown in FIG. 9H. Similarly, the exemplary structure of FIG. 9I may further include a layer of the first type of material 204 formed adjacent to the layer of the second type of material 202 opposite the $n^{th}$ stack as shown in FIG. 9F.

The multilayer structure of FIG. 9A is not limited to the exemplary structures of FIGS. 9B-9I and may be constructed from a combination of the exemplary structures of FIGS. 9B-9I. For example, the multilayered structure of FIG. 9A may have a layer of the third type of material 200 formed adjacent to the first stack and a layer of the first type of material 204 formed adjacent to the $n^{th}$ stack by combining the exemplary structures of FIGS. 9C and 9G. The layer of the first type of material 194 in a stack 192 may have a different thickness compared with other layers of the first type of material in other stacks. The layer of the second type of material 196 in a stack 192 may also have a different thickness compared with other layers of the second type of material in other stacks. Similarly, the layer of the third type of material 198 in a stack 192 may have a different thickness compared with other layers of the third type of material in other stacks. One or more layers of the three layers of materials 194-198 may be extremely thin and thus have fragmented coverage and/or are perforated with holes. The layer thicknesses of the first, second, and third types of materials 204, 202, and 200 at the periphery may or may not be same as the layer thicknesses of the first, second, and third types of materials 194, 196, and 198 of the trilayer unit structure 192, respectively. The stacking sequences of the exemplary multilayer structures of FIGS. 9A-9I may be inverted.

Each of the first type of material 194 and 204, the second type of material 196 and 202, and the third type of material 198 and 200 may be made of any suitable material, such as but not limited to Co, Ni, Fe, CoNi, CoFe, NiFe, CoNiFe, Pt, Pd, Ni, Ir, Cr, V, Ti, Zr, Hf, Nb, Ta, Mo, W, NiCr, NiV, NiTi, NiZr, NiHf, NiNb, NiTa, NiMo, NiW, or any combination thereof. Therefore, one or more of the magnetic layers 152-156, 160-166, 170-176, and 180 may include a multilayer structure, such as but not limited to [Co/Cr/Ni], [Co/Ni/Cr], [Co/Ir/Ni], [Co/Ni/Ir], [Ni/Co/Cr], [Ni/Cr/Co], [Ni/Co/Ir], [Ni/Ir/Co], [Co/V/Ni], [Co/Ni/V], [Ni/Co/V], [Ni/V/Co], [Co/Cr/Pt], [Co/Cr/Pd], [Co/Cr/Ir], [CoFe/Cr/Ni], [CoFe/Pd/Ni], [CoFe/V/Ni], [CoFe/Ir/Ni], [Co/NiCr/Ni], or any combination thereof. The multilayer structure may have a face-centered cubic (FCC) type of lattice structure, which is different from the body-centered cubic structure (BCC) of some ferromagnetic materials, such as Fe, CoFe, and CoFeB, and the halite-like cubic lattice structure of magnesium oxide (MgO) that may be used as the insulating tunnel junction layer 140. All individual magnetic layers of a magnetic multilayer structure may have the same magnetization direction. The multilayer structure may or may not exhibit the characteristic satellite peaks associated with superlattice when analyzed by X-ray, neutron diffraction, or other diffraction techniques.

Figure 10:
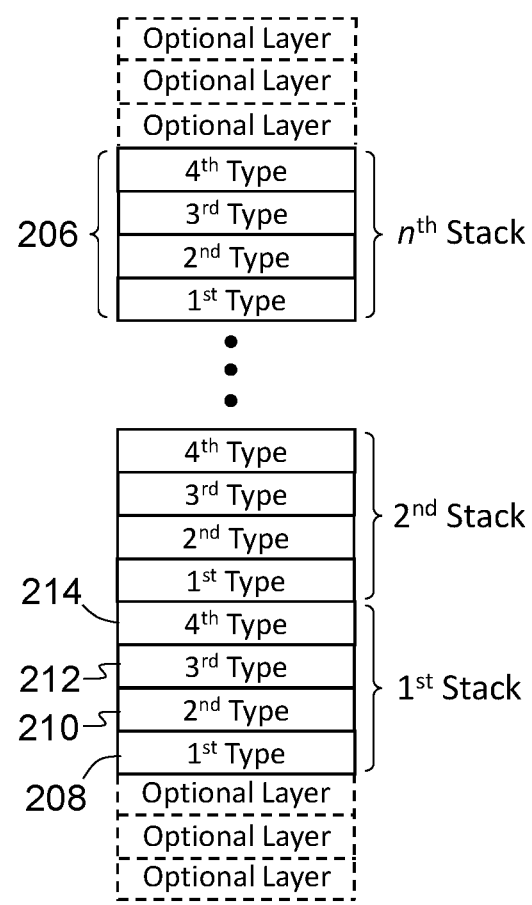
FIG. 10 is a cross-sectional view of an exemplary multilayer structure comprising one or more stacks of a quad-layer unit structure.

One or more of the magnetic layers 152-156, 160-166, 170-176, and 180 may alternatively have a multilayer structure formed by one (n=1) or more stacks of a quadlayer unit structure 206 as illustrated in FIG. 10. The quadlayer unit structure 206 includes a layer of a first type of material 208, a layer of a second type of material 210, a layer of a third type of material 212, and a layer of a fourth type of material 214 formed adjacent to each other. At least one of the four types of materials 208-214 is magnetic. One or more layers of the four layers of materials 208-214 may be extremely thin and thus have fragmented coverage and/or are perforated with holes. The multilayer structure of FIG. 10 may include one or more additional layers made of the first, second, third, and fourth types of materials formed adjacent to the first stack and/or the $n^{th}$ stack thereof. The stacking sequence of the multilayer structure of FIG. 10 may be inverted. All individual magnetic layers of a magnetic multilayer structure may have the same magnetization direction.

Each of the first, second, third, and fourth types of materials 208-214 may be made of any suitable material, such as but not limited to Co, Ni, Fe, CoNi, CoFe, NiFe, CoNiFe, Pt, Pd, Ni, Ir, Cr, V, Ti, Zr, Hf, Nb, Ta, Mo, W, NiCr, NiV, NiTi, NiZr, NiHf, NiNb, NiTa, NiMo, NiW, or any combination thereof. Moreover, two of the four types of materials 208-214 not in contact may have the same composition. For example, the first and third types of materials 208 and 212 or the second and fourth types of materials 210 and 214 may have the same composition. Therefore, one or more of the magnetic layers 152-156, 160-166, 170-176, and 180 may include a multilayer structure, such as but not limited to [Ni/Co/Ni/Cr], [Co/Ni/Co/Cr], [Co/Cr/Ni/Cr], [Ni/Co/Ni/Ir], [Co/Ni/Co/Ir], [Co/Ir/Ni/Ir], [Co/Ir/Ni/Cr], [Co/Ir/Co/Cr], or any combination thereof. The layer of each of the first, second, third, and fourth types of materials 208-214 in a stack 206 may have a different thickness compared with the layers of the same type of material in other stacks. The multilayer structure may or may not exhibit the characteristic satellite peaks associated with superlattice when analyzed by X-ray, neutron diffraction, or other diffraction techniques.

The insulating tunnel junction layer 140 of the MTJ structures 130 and 130' in FIGS. 4A and 4B, respectively, may be formed of a suitable insulating material containing oxygen, nitrogen, or both, such as but not limited to magnesium oxide (MgO), aluminum oxide ($AlO_x$), titanium oxide ($TiO_x$), zirconium oxide ($ZrO_x$), hafnium oxide ($HfO_x$), vanadium oxide ($VO_x$), tantalum oxide ($TaO_x$), chromium oxide ($CrO_x$), molybdenum oxide ($MoO_x$), tungsten oxide ($WO_x$), gallium oxide ($GaO_x$), silicon oxide ($SiO_x$), silicon nitride ($SiN_x$), $MgTiO_x$, $MgAlO_x$, $AlTiO_x$, or any combination thereof. The insulating tunnel junction layer 140 may have a composite structure comprising two layers of insulating materials, each of which is made of a suitable insulating material as described above. For example, the composite tunnel junction layer may include a layer of magnesium oxide and a layer of titanium oxide.

The anti-ferromagnetic coupling layer 142, which anti-ferromagnetically couples the magnetic fixed layer 144 to the magnetic reference layers 138 of the MTJ structures 130 and 130' in FIGS. 4A and 4B, respectively, may be made of a suitable coupling material, such as but not limited to ruthenium (Ru), vanadium (V), niobium (Nb), tantalum (Ta), chromium (Cr), molybdenum (Mo), tungsten (W), manganese (Mn), rhenium (Re), osmium (Os), rhodium (Rh), iridium (Ir), copper (Cu), or any combination thereof.

The anti-ferromagnetic coupling layer 142 may have a composite structure that includes two or more sublayers. Each of the sublayers may be made of a suitable coupling material described above.

The perpendicular enhancement layers (PELs) 158, 168, and 178 may comprise one or more of the following elements: B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, O, N, and C, thereby forming a suitable perpendicular enhancement material, such as but not limited to B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, MgO, $TiO_x$, $ZrO_x$, $HfO_x$, $VO_x$, $NbO_x$, $TaO_x$, $CrO_x$, $MoO_x$, $WO_x$, $RhO_x$, $NiO_x$, $PdO_x$, $PtO_x$, $CuO_x$, $AgO_x$, $RuO_x$, $SiO_x$, $TiN_x$, $ZrN_x$, $HfN_x$, $VN_x$, $NbN_x$, $TaN_x$, $CrN_x$, $MoN_x$, $WN_x$, $NiN_x$, $PdN_x$, $PtN_x$, $RuN_x$, $SiN_x$, $TiO_xN_y$, $ZrO_xN_y$, $HfO_xN_y$, $VO_xN_y$, $NbO_xN_y$, $TaO_xN_y$, $CrO_xN_y$, $MoO_xN_y$, $WO_xN_y$, $NiO_xN_y$, $PdO_xN_y$, $PtO_xN_y$, $RuO_xN_y$, $SiO_xN_y$, $TiRuO_x$, $ZrRuO_x$, $HfRuO_x$, $VRuO_x$, $NbRuO_x$, $TaRuO_x$, $CrRuO_x$, $MoRuO_x$, $WRuO_x$, $RhRuO_x$, $NiRuO_x$, $PdRuO_x$, $PtRuO_x$, $CuRuO_x$, $AgRuO_x$, CoFeB, CoFe, NiFe, CoFeNi, CoTi, CoZr, CoHf, CoV, CoNb, CoTa, CoFeTa, CoCr, CoMo, CoW, NiCr, NiTi, NiZr, NiHf, NiV, NiNb, NiTa, NiMo, NiW, CoNiTa, CoNiCr, CoNiTi, FeTi, FeZr, FeHf, FeV, FeNb, FeTa, FeCr, FeMo, FeW, or any combination thereof. In cases where the perpendicular enhancement material contains one or more ferromagnetic elements, such as Co, Fe, and Ni, the total content of the ferromagnetic elements of the perpendicular enhancement material may be less than the threshold required for becoming magnetic, thereby rendering the material essentially non-magnetic. Alternatively, the perpendicular enhancement material that contains one or more ferromagnetic elements may be very thin, thereby rendering the material paramagnetic or magnetically dead. One or more of the PELs 158, 168, and 178 may have a multilayer structure comprising two or more layers of perpendicular enhancement sublayers, each of which is made of a suitable perpendicular enhancement material described above. For example, one or more of the PELs 158, 168, and 178 may have a bilayer structure, such as but not limited to W/Ta, Ta/W, Mo/Ta, Ta/Mo, W/Hf, Hf/W, Mo/Hf, or Hf/Mo.

The optional seed layer 132 of the MTJ memory elements 106 and 106' may have a single layer structure or may comprise two, three, four, or more sublayers formed adjacent to each other. One or more of the single layer and the multiple sublayers of the seed layer 132 comprise one or more of the following elements: B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, O, N, and C, thereby forming a suitable seed material such as one of those discussed above for the perpendicular enhancement material. For example, the seed layer 132 may be made of a single layer of MgO, Ta, Hf, W, Mo, Ru, Pt, Pd, NiCr, NiTa, NiTi, or $TaN_x$. Alternatively, the seed layer 132 may have a bilayer structure (Ru/Ta) comprising a Ta sublayer formed adjacent to one of the magnetic structures 136 and 144 and a Ru sublayer formed beneath the Ta sublayer. Other exemplary bilayer structures (bottom/top), such as Ta/Ru, Ta/Hf, Hf/Ta, Ta/W, W/Ta, W/Hf, Hf/W, Mo/Ta, Ta/Mo, Mo/Hf, Hf/Mo, Ru/W, W/Ru, MgO/Ta, Ta/MgO, Ru/MgO, Hf/MgO, and W/MgO, may also be used for the seed layer 132. Still alternatively, the seed layer 132 may have a bilayer structure comprising an oxide sublayer, such as MgO, formed adjacent to one of the magnetic structures 136 and 144 and an underlying, thin conductive sublayer, such as CoFeB which may be non-magnetic or amorphous or both. Additional seed sublayers may further form beneath the exemplary CoFeB/

MgO seed layer to form other seed layer structures, such as but not limited to Ru/CoFeB/MgO, Ta/CoFeB/MgO, W/CoFeB/MgO, Hf/CoFeB/MgO, Ta/Ru/CoFeB/MgO, Ru/Ta/CoFeB/MgO, W/Ta/CoFeB/MgO, Ta/W/CoFeB/MgO, W/Ru/CoFeB/MgO, Ru/W/CoFeB/MgO, Hf/Ta/CoFeB/MgO, Ta/Hf/CoFeB/MgO, W/Hf/CoFeB/MgO, Hf/W/CoFeB/MgO, Hf/Ru/CoFeB/MgO, Ru/Hf/CoFeB/MgO, Ta/W/Ru/CoFeB/MgO, Ta/Ru/W/CoFeB/MgO, and Ru/Ta/Ru/CoFeB/MgO. Still alternatively, the seed layer 132 may have a multilayer structure formed by interleaving seed sublayers of a first type with seed sublayers of a second type. One or both types of the seed sublayers may comprise one or more ferromagnetic elements, such as Co, Fe, and Ni. For example, the seed layer 132 may be formed by interleaving layers of Ni with layers of a transition metal, such as but not limited to Ti, Zr, Hf, V, Nb, Ta, Cr, Mo, W, or any combination thereof. One or both types of seed sublayers may be amorphous or noncrystalline. For example, the first and second types of sublayers may respectively be made of Ta and CoFeB, both of which may be amorphous.

The optional cap layer 134 of the MTJ memory elements 106 and 106' may have a single layer structure or may comprise two, three, four, or more sublayers formed adjacent to each other. One or more of the single layer and the multiple sublayers of the cap layer 134 may comprise one or more of the following elements: B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, O, N, and C, thereby forming a suitable cap material such as one of those discussed above for the perpendicular enhancement material. For example, the cap layer 134 may be made of a single layer of MgO, Ta, Hf, W, Mo, Ru, Pt, or Pd. Alternatively, the cap layer 134 may have a bilayer structure (W/Ta) comprising a W sublayer formed adjacent to one of the magnetic structures 136 and 144 and a Ta sublayer formed on top of the W sublayer. Other exemplary bilayer structures (bottom/top), such as Ta/Ru, Ru/Ta, Ta/Hf, Hf/Ta, Ta/W, Mo/Ta, Ta/Mo, W/Hf, Hf/W, Mo/Hf, Hf/Mo, Ru/W, W/Ru, MgO/Ta, Ta/MgO, MgO/Ru, MgO/Hf, and MgO/W, may also be used for the cap layer 134. Still alternatively, the cap layer 134 may have a bilayer structure comprising an oxide sublayer, such as MgO, formed adjacent to one of the magnetic structures 136 and 144 and a thin conductive sublayer, such as CoFeB which may be non-magnetic or superparamagnetic. Additional cap sublayers may further form on top of the exemplary MgO/CoFeB cap layer to form other cap layer structures, such as but not limited to MgO/CoFeB/Ru, MgO/CoFeB/Ta, MgO/CoFeB/W, MgO/CoFeB/Hf, MgO/CoFeB/Ru/Ta, MgO/CoFeB/Ta/Ru, MgO/CoFeB/W/Ta, MgO/CoFeB/Ta/W, MgO/CoFeB/W/Ru, MgO/CoFeB/Ru/W, MgO/CoFeB/Hf/Ta, MgO/CoFeB/Ta/Hf, MgO/CoFeB/Hf/W, MgO/CoFeB/W/Hf, MgO/CoFeB/Hf/Ru, MgO/CoFeB/Ru/Hf, MgO/CoFeB/Ru/W/Ta, MgO/CoFeB/W/Ru/Ta, and MgO/CoFeB/Ru/Ta/Ru. As such, the cap layer 132 may comprise an insulating cap sublayer and one or more conductive cap sublayers formed thereon.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. A magnetic structure comprising:
    a seed layer; and
    a magnetic fixed layer structure formed adjacent to said seed layer and having a first invariable magnetization direction substantially perpendicular to a layer plane thereof,
    wherein said magnetic fixed layer structure includes a trilayer unit structure and at least one repeat thereof in contiguous contact, said trilayer unit structure including three layers of different materials in contiguous contact with at least one of said three layers of different materials being magnetic.

2. The magnetic structure of claim 1, wherein said trilayer unit structure includes a layer of cobalt, a layer of chromium, and a layer of nickel.

3. The magnetic structure of claim 1, wherein said trilayer unit structure includes a layer of Co, a layer of a transition metal, and a layer of Ni, said transition metal being selected from the group consisting of titanium, zirconium, hafnium, vanadium, niobium, tantalum, molybdenum, and tungsten.

4. The magnetic structure of claim 1 further comprising:
    an anti-ferromagnetic coupling layer formed adjacent to said magnetic fixed layer structure opposite said seed layer; and
    a magnetic reference layer formed adjacent to said anti-ferromagnetic coupling layer opposite said magnetic fixed layer structure, said magnetic reference layer having a second invariable magnetization direction that is substantially perpendicular to a layer plane thereof and is substantially opposite to said first invariable magnetization direction.

5. A magnetic tunnel junction (MTJ) memory element comprising:
    a magnetic free layer structure including one or more magnetic free layers that have a variable magnetization direction substantially perpendicular to layer planes thereof;
    an insulating tunnel junction layer formed adjacent to said magnetic free layer structure;
    a magnetic reference layer structure formed adjacent to said insulating tunnel junction layer opposite said magnetic free layer structure, said magnetic reference layer structure including one or more magnetic reference layers that have a first invariable magnetization direction substantially perpendicular to layer planes thereof;
    an anti-ferromagnetic coupling layer formed adjacent to said magnetic reference layer structure opposite said insulating tunnel junction layer; and
    a magnetic fixed layer structure formed adjacent to said anti-ferromagnetic coupling layer opposite said magnetic reference layer structure, said magnetic fixed layer structure having a second invariable magnetization direction that is substantially perpendicular to a layer plane thereof and is substantially opposite to said first invariable magnetization direction,
    wherein said magnetic fixed layer structure includes a trilayer unit structure and at least one repeat thereof in contiguous contact, said trilayer unit structure including three layers of different materials in contiguous contact with at least one of said three layers of different materials being magnetic.

6. The MTJ memory element of claim 5, wherein said trilayer unit structure includes a layer of cobalt, a layer of chromium, and a layer of nickel.

7. The MTJ memory element of claim 5, wherein said trilayer unit structure includes a layer of Co, a layer of a transition metal, and a layer of Ni, said transition metal being selected from the group consisting of titanium, zirconium, hafnium, vanadium, niobium, tantalum, molybdenum, and tungsten.

8. The MTJ memory element of claim 5, wherein said magnetic reference layer structure includes a first magnetic reference layer formed adjacent to said insulating tunnel junction layer and a second magnetic reference layer separated from said first magnetic reference layer by a perpendicular enhancement layer (PEL).

9. The MTJ memory element of claim 8, wherein said PEL is made of molybdenum.

10. The MTJ memory element of claim 8, wherein said second magnetic reference layer has a multilayer structure comprising layers of a first material interleaved with layers of a second material, at least one of said first and second materials being magnetic.

11. The MTJ memory element of claim 10, wherein said first and second materials are cobalt and platinum, respectively.

12. The MTJ memory element of claim 8, wherein said first magnetic reference layer comprises cobalt, iron, and boron.

13. The MTJ memory element of claim 5, wherein said magnetic free layer structure includes a first magnetic free layer formed adjacent to said insulating tunnel junction layer and a second magnetic free layer separated from said first magnetic free layer by a perpendicular enhancement layer (PEL).

14. The MTJ memory element of claim 13, wherein said PEL is made of molybdenum.

15. The MTJ memory element of claim 13, wherein each of said first and second magnetic free layers comprises cobalt, iron, and boron.

16. The magnetic structure of claim 4, wherein said anti-ferromagnetic coupling layer comprises iridium.

17. The MTJ memory element of claim 5, wherein said anti-ferromagnetic coupling layer comprises iridium.

* * * * *